United States Patent
Cai et al.

(10) Patent No.: US 9,613,925 B2
(45) Date of Patent: Apr. 4, 2017

(54) METHOD FOR BONDING SEMICONDUCTOR DEVICES ON SUSTRATE AND BONDING STRUCTURE FORMED USING THE SAME

(71) Applicant: TSINGHUA UNIVERSITY, Beijing (CN)

(72) Inventors: Jian Cai, Beijing (CN); Ziyu Liu, Beijing (CN); Qian Wang, Beijing (CN); Shuidi Wang, Beijing (CN); Yang Hu, Beijing (CN); Yu Chen, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 14/392,281

(22) PCT Filed: Jan. 26, 2014

(86) PCT No.: PCT/CN2014/071483
§ 371 (c)(1),
(2) Date: Dec. 24, 2015

(87) PCT Pub. No.: WO2014/206086
PCT Pub. Date: Dec. 31, 2014

(65) Prior Publication Data
US 2016/0172326 A1 Jun. 16, 2016

(30) Foreign Application Priority Data

Jun. 27, 2013 (CN) .......................... 2013 1 0263865

(51) Int. Cl.
*H01L 23/00* (2006.01)

(52) U.S. Cl.
CPC .............. *H01L 24/81* (2013.01); *H01L 24/13* (2013.01); *H01L 24/14* (2013.01); *H01L 24/17* (2013.01);
(Continued)

(58) Field of Classification Search
CPC ....... H01L 21/60; H01L 25/065; H01L 25/07; H01L 25/18; H01L 24/81; H01L 24/17;
(Continued)

(56) References Cited

U.S. PATENT DOCUMENTS 7,485,968 B2 * 2/2009 Enquist ............. H01L 21/76898
257/777
9,273,724 B1 * 3/2016 Rosenholm ........... F16C 33/043
(Continued)

FOREIGN PATENT DOCUMENTS

CN 101479841 A 7/2008
CN 101558483 A * 10/2009 ......... H01L 21/4763
(Continued)

OTHER PUBLICATIONS

International Search Report mailed in corresponding PCT/CN2014/071483 on May 5, 2014, consisting of 5 pp.

*Primary Examiner* — Alexander Oscar Williams
(74) *Attorney, Agent, or Firm* — Volpe and Koenig, P.C.

(57) ABSTRACT

The present invention provides a bonding method in semiconductor manufacturing process and a bonding structure formed using the same, which can achieve wafer-level bonding under a condition of normal temperature and low pressure. The bonding method comprises generating bonding structures capable of being mutually mechanical interlocked, wherein the frictional heat generated by the bonding structures capable of being mutually mechanical interlocked is higher than the bonding energy therebetween, and utilizing the frictional heat generated by the bonding structures (Continued)

capable of being mutually mechanical interlocked to bond the bonding structures capable of being mutually mechanical interlocked.

18 Claims, 3 Drawing Sheets

(52) U.S. Cl.
CPC ............... *H01L 2224/13011* (2013.01); *H01L 2224/13015* (2013.01); *H01L 2224/13017* (2013.01); *H01L 2224/13023* (2013.01); *H01L 2224/14051* (2013.01); *H01L 2224/1705* (2013.01); *H01L 2224/17107* (2013.01); *H01L 2224/8122* (2013.01); *H01L 2224/8182* (2013.01); *H01L 2224/81193* (2013.01); *H01L 2224/81194* (2013.01); *H01L 2224/81201* (2013.01); *H01L 2224/81345* (2013.01); *H01L 2224/81355* (2013.01); *H01L 2224/81359* (2013.01); *H01L 2224/81897* (2013.01); *H01L 2224/94* (2013.01)

(58) Field of Classification Search
CPC ... H01L 2224/17107; H01L 2224/1705; H01L 2224/81897; H01L 2224/81355; H01L 2224/81201; H01L 2224/8122
USPC ................. 257/738, 778, E21.506, E21.614, 257/E21.705, 737; 228/1.1, 180.22, 199, 228/20.1, 248.1, 256, 33, 41; 438/107, 438/613

See application file for complete search history.

(56) References Cited

U.S. PATENT DOCUMENTS

| | | | |
|---|---|---|---|
| 2003/0209288 A1* | 11/2003 | Huang | B22D 19/0027 148/220 |
| 2004/0079634 A1* | 4/2004 | Wickersham, Jr. | B21K 25/00 204/298.12 |
| 2004/0121576 A1 | 6/2004 | Su | |
| 2005/0012212 A1* | 1/2005 | Gilleo | B81C 3/002 257/737 |
| 2007/0037379 A1* | 2/2007 | Enquist | H01L 21/76898 438/618 |
| 2007/0084719 A1* | 4/2007 | Wickersham, Jr. | C23C 14/3407 204/298.12 |
| 2009/0068831 A1* | 3/2009 | Enquist | H01L 21/76898 438/618 |
| 2010/0084110 A1* | 4/2010 | Strom | B22D 19/04 164/498 |
| 2010/0089980 A1* | 4/2010 | Maeda | B23K 1/0016 228/199 |
| 2010/0093131 A1* | 4/2010 | Maeda | B23K 1/0016 438/107 |
| 2010/0178062 A1* | 7/2010 | Zhang | H04B 10/5055 398/154 |
| 2014/0272248 A1* | 9/2014 | Chamberlain | F01D 5/005 428/63 |

FOREIGN PATENT DOCUMENTS

| | | | | |
|---|---|---|---|---|
| CN | 101558483 A | 10/2009 | | |
| CN | 101681850 A | 3/2010 | | |
| CN | 103354210 A | * 10/2013 | ............ | H01L 21/60 |
| CN | 103354210 A | 10/2013 | | |
| WO | WO-2007/021639 A2 | 2/2007 | | |
| WO | 2007/126228 A1 | 11/2007 | | |

* cited by examiner

METHOD FOR BONDING SEMICONDUCTOR DEVICES ON SUSTRATE AND BONDING STRUCTURE FORMED USING THE SAME

TECHNICAL FIELD

The present invention relates to the field of semiconductor manufacturing, in particular to a bonding method and a bonding structure formed with the bonding method.

BACKGROUND

Currently, methods for Cu—Cu bonding mainly include thermosonic bonding, thermocompression bonding, and surface modification bonding, etc., all of these bonding methods have drawbacks such as high bonding temperature, high bonding pressure, or high surface modification cost, etc. Owing to the excessively high bonding temperature and pressure, it is unable to carry out bonding of wafer with semiconductor devices or bonding of thin chips in the semiconductor manufacturing process.

SUMMARY

To overcome the above-mentioned drawbacks in the Cu—Cu bonding, the present invention provides a bonding method and a bonding structure formed with the bonding method.

The present invention provides a bonding method, comprising:

generating bonding structures capable of being mutually mechanical interlocked, wherein, the frictional heat generated by the bonding structures capable of being mutually mechanical interlocked is higher than the bonding energy therebetween; and utilizing the frictional heat generated by the bonding structures capable of being mutually mechanical interlocked to bond the bonding structures capable of being mutually mechanical interlocked.

The present invention further provides a bonding structure formed with the above-mentioned bonding method.

Since the bonding method and the bonding structure according to the present invention utilize the frictional heat generated by the bonding structures capable of being mutually mechanical interlocked which is higher than the bonding energy therebetween to accomplish bonding, the bonding can be conducted at normal temperature and low pressure.

BRIEF DESCRIPTION OF THE DRAWINGS

The accompanying drawings are provided here to facilitate further understanding on the present invention, and constitute a part of this document. They are used in conjunction with the following embodiments to explain the present invention, but shall not be comprehended as constituting any limitation to the present invention, wherein.

DETAILED DESCRIPTION

Hereafter the embodiments of the present invention will be detailed, with reference to the accompanying drawings. It should be appreciated that the embodiments described here are only provided to describe and explain the present invention, but shall not be deemed as constituting any limitation to the present invention.

Figure 1:
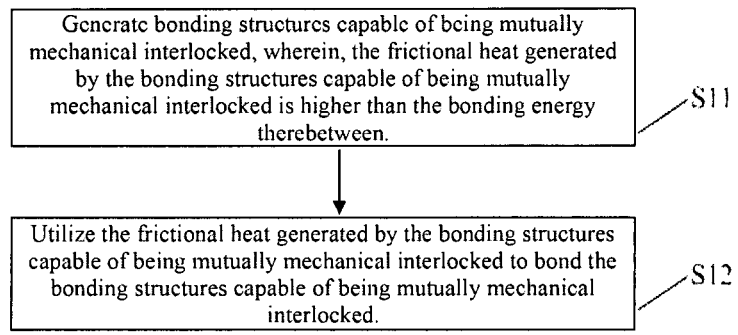
FIG. 1 is a flow chart of the bonding method according to the present invention.

As shown in FIG. 1, the bonding method according to the present invention can comprise the following steps:

S11. generating bonding structures capable of being mutually mechanical interlocked, wherein, the frictional heat generated by the bonding structures capable of being mutually mechanical interlocked is higher than the bonding energy therebetween.

Figure 8:
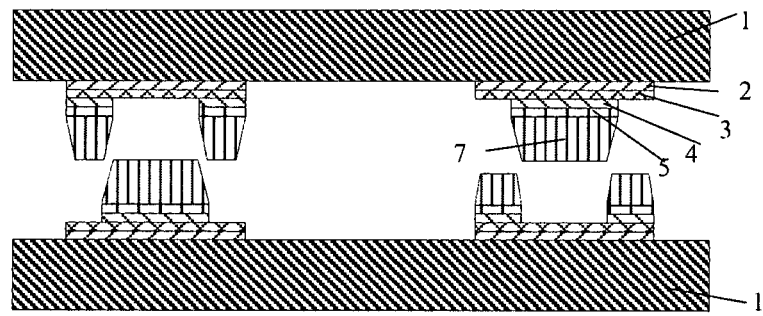
FIG. 8 shows illustrative bonding structures capable of being mutually bonded, with beveled bonding sections.

The types of bonding structures capable of being mutually mechanical interlocked can be those shown in FIGS. 2-6, wherein, FIGS. 2a, 3a, 4a, 5a, and 6a are top views of bonding structures capable of being mutually mechanical interlocked, while FIGS. 2b, 3b, 4b, 5b, and 6b are sectional views of the structures shown in FIGS. 2a, 3a, 4a, 5a, and 6a when viewed along the direction of the bold arrow in each figure. However, those skilled in the art should appreciate that other bonding structures capable of being mutually mechanical interlocked are also possible in actual applications, and FIGS. 2-6 are only illustrative. Namely, there is no particular limitation on the shape and size of the bonding structures and the shape and size of the bumps on the bonding structures, and various bonding structures belong to the scope of the present invention as long as they can be mutually mechanical interlocked and the bonding is realized under a principle that the frictional heat generated by the bonding structures is higher than the bonding energy therebetween. Moreover, the bonding structures capable of being mutually mechanical interlocked with beveled bonding sections as shown in FIG. 8 are also in the scope of the present invention. Such beveled bonding sections may be formed in consideration of the specific process, and, of course, they can be made artificially and intentionally. In addition, such bonding structures with beveled bonding sections make the bonding easier.

S12. utilizing the frictional heat generated by the bonding structures capable of being mutually mechanical interlocked to bond the bonding structures capable of being mutually mechanical interlocked.

Preferably, in the step S11, the procedure of generating bonding structures capable of being mutually mechanical interlocked may comprise: forming a first under-bump metal (UBM) layer pattern on a substrate; forming a second UBM layer pattern on the first UBM layer pattern; and, forming a bump on the second UBM layer pattern, so as to form the bonding structures capable of being mutually mechanical interlocked, wherein, the bump can be bonded with the first UBM layer pattern when the bonding structures capable of being mutually mechanical interlocked are bonded.

Preferably, the bump is bonded with the first UBM layer pattern by pressurized thermal annealing. Preferably, the first UBM layer pattern is composed of an adhesion layer on the substrate and a seed layer on the adhesion layer. Preferably, the adhesion layer is formed by a metal material that can adhere to the substrate (e.g., silicon substrate, silicon dioxide substrate, etc.), for example, the metal material can be at least one of TiN, TiW, Ti, Cr, Ta, Mo, and Co, etc. Preferably, the seed layer is also formed by a metal material, such as Cu, Au, or Ni, etc.

In addition, the bump may also be formed by a metal material.

FIGS. 7a-7g show illustrative flow charts of generating bonding structures capable of being mutually mechanical interlocked. However, those skilled in the art should appreciate that those flow charts are only illustrative, and any method or process that can be used to form bonding structures capable of being mutually mechanical interlocked in the semiconductor field can be used, including any processing method in semiconductor CMOS manufacture process and bipolar manufacture process.

Figure 7A:
FIGS. 7a-7g are illustrative flow charts of generating bonding structures capable of being mutually mechanical interlocked.

First, as shown in FIG. 7a, a first adhesion layer 2 and a first seed layer 3 are formed as an under-bump metal (UBM) layer on a substrate 1 by sputtering, and the first adhesion layer 2 and the first seed layer 3 are photoetched with a masking technique, so as to form the pattern shown in FIG. 7a, wherein, the first adhesion layer 2 is usually formed by at least one of TiN, TiW and Ti, and the first seed layer 3 is usually formed by Cu.

Figure 7B:
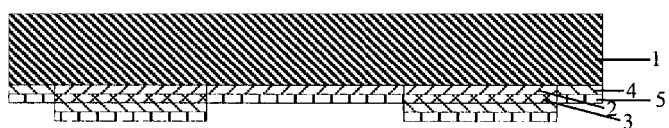

Then, as shown in FIG. 7b, a second UBM layer is formed by sputtering, and the second UBM layer can be composed of a second adhesion layer 4 and a second seed layer 5.

Figure 7C:
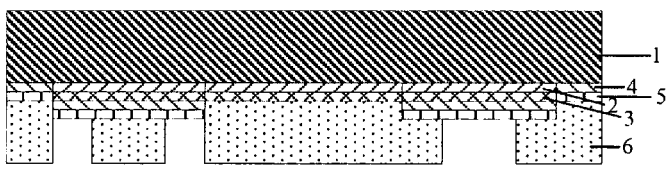

Next, as shown in FIG. 7c, a mask layer 6 is formed on the second UBM layer, and is photoetched to form an area where a bump is to be formed subsequently.

Figure 7D:
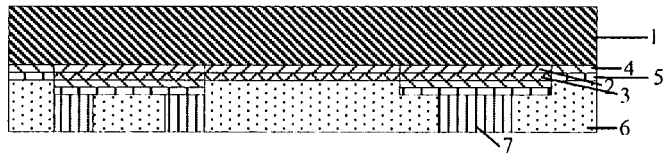
Figure 7E:
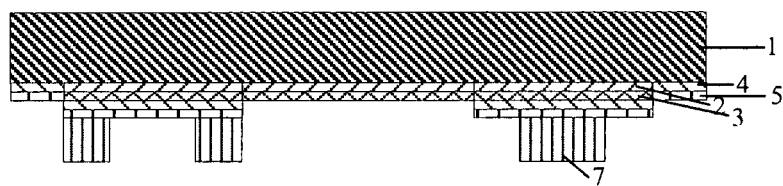
Figure 7F:
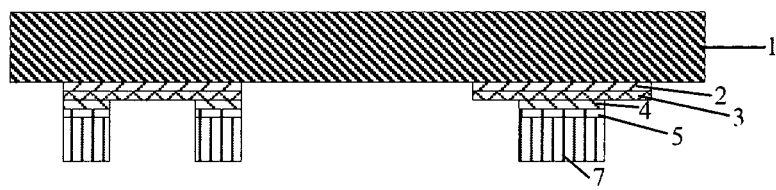
Figure 7G:
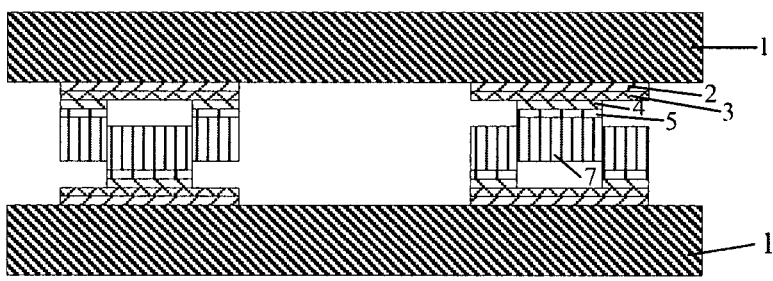

Next, as shown in FIG. 7d, a bump 7 is formed by electroplating or sputtering, etc. Next, as shown in FIG. 7e, the mask layer 6 is removed. Next, the second UBM layer is photoetched, to obtain the pattern shown in FIG. 7f. Finally, bonding is accomplished on a flip-chip bonding apparatus, as shown in FIG. 7g.

Thus, by utilizing the frictional heat generated by the bumps which is higher than the bonding energy between the bumps, the bonding at the bump-to-bump interface can be realized by applying very low force (as long as the force is higher than the friction force between the bumps) in the bonding process. To relieve the stress and enhance the strength of the bonding interface, in the step shown in FIG. 7g the bonding structures are annealed for 30 min. at 100° C. after the bonding is completed mainly utilizing the frictional heat generated by the side walls of the bumps and mechanical interlock. In addition, the top of the bump 7 can not be bonded if the first adhesion layer 2 and the first seed layer 3 are not formed. Therefore, to increase reliability, preferably the bonding of the top of the bump 7 is accomplished by thermocompression bonding after the first adhesion layer 2 and the first seed layer 3 are formed and the bonding of the side walls of the bump 7 is completed, i.e., pressurized thermal annealing is carried out after the bonding of the side walls of the bump 7 is completed, to facilitate the bonding between the top of the bump 7 and the first seed layer 3. However, according to method disclosed in the present invention, forming the first seed layer 3 and the first adhesion layer 2 is not an indispensable procedure.

Figure 2A:
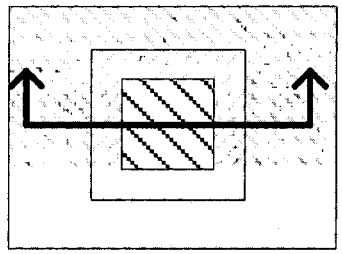
FIGS. 2a, 3a, 4a, 5a, and 6a are top views of illustrative bonding structures capable of being mutually mechanical interlocked.
Figure 2B:
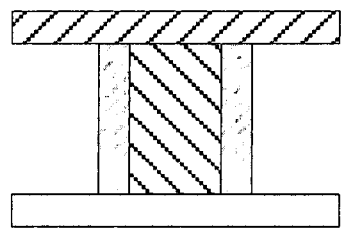
FIGS. 2b, 3b, 4b, 5b, and 6b are sectional views of the structures shown in FIGS. 2a, 3a, 4a, 5a, and 6a when viewed along the direction of the bold arrow in each figures.
Figure 3A:
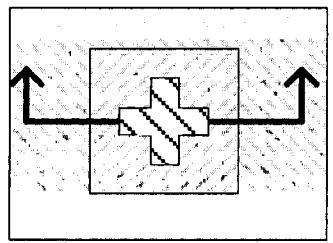
Figure 3B:
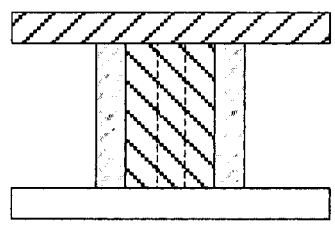
Figure 4A:
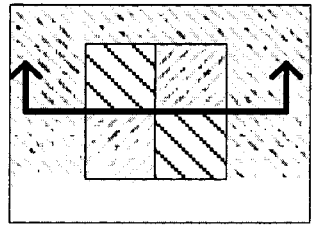
Figure 4B:
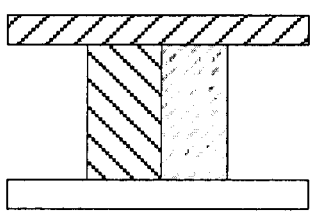
Figure 5A:
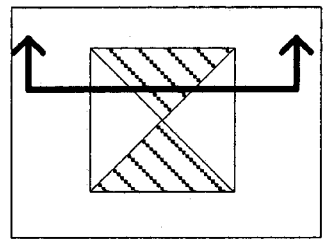
Figure 5B:
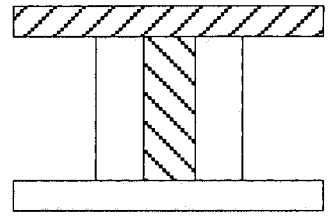
Figure 6A:
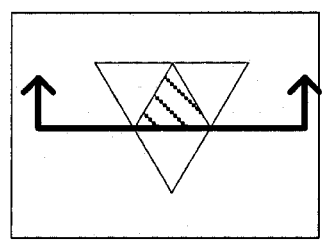
Figure 6B:
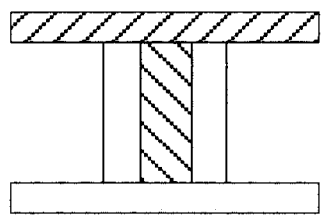

The bonding principle of the bonding method according to the present invention is as follows:

According to the formula of maximum static frictional force: $f=\mu \times N$, where, $\mu$ is maximum static friction coefficient (for example, in the case that the bump 7 is made of copper, the Cu—Cu static friction coefficient is 1.6 (please see the Table 3.1 in Vol. I "Mechanics" of "Berkeley Physics Tutorial" by C. Kittel, et al), N is positive pressure, and $N=\tau \times S$, where, $\tau$ is the maximum critical shearing stress of the bump (in the case of a bump made of copper, the theoretical maximum critical shearing stress of copper is 1500 MPa, but the practical value is much lower than that value), S is the lateral stressed area of the bump. The frictional heat is $W=f \times H=\mu \times N \times H=\mu \times \tau \times S \times H$, where, W is frictional heat, f is maximum static frictional force, and H is the height of the bump. For example, for the bonding structures capable of being mutually mechanical interlocked as shown in FIGS. 2a and 2b, the frictional heat per unit area can be expressed as:

$$W_s = \frac{W}{(L-2\times L1)\times H} = \frac{f\times H}{(L-2\times L1)\times H} = \frac{\mu\times\tau\times((L-2\times L1)\times L1)\times H}{(L-2\times L1)\times H} = \mu\times\tau\times L1$$

If the frictional heat per unit area is higher than the bonding energy between the bumps, bonding can be accomplished without external heat. In the case that the bump 7 is made of copper, since the bonding energy of copper is 3 J/m2, bonding can be realized as long as the L1 is at the order of micrometer, and the required pressure only has to be higher than the maximum static frictional force. The calculated frictional force is much lower than 1N when the L of the bump 7 is 6 μm, which means the required pressure is very low; in other words, the bonding can be accomplished by applying very low pressure only. Hence, the bonding method disclosed in the present invention can be used to accomplish wafer-level bump bonding at normal temperature and low pressure.

The present invention further provides a bonding structure formed with the above-mentioned bonding method. Since illustrative bonding structures capable of being mutually mechanical interlocked have been described above in detail in conjunction with the bonding method according to the present invention, the bonding structure will not be further detailed here. In addition, the bonding method according to the present invention can not only be applied for wafer-level bonding but also for chip-level and system-level bonding.

While the present invention is disclosed as above in some embodiments, the embodiments shall not be deemed as constituting any limitation to the present invention. Those skilled in the art can easily make various alternations and modifications to the embodiments without departing from the spirit and scope of the present invention. Therefore, the protected domain of the present invention shall be only confined by the claims.

The invention claimed is:
1. A bonding method, comprising:
   generating bonding structures capable of being mutually mechanical interlocked, wherein, the frictional heat generated by the bonding structures capable of being mutually mechanical interlocked is higher than the bonding energy therebetween; and
   utilizing the frictional heat generated by the bonding structures capable of being mutually mechanical interlocked to bond the bonding structures capable of being mutually mechanical interlocked;
   wherein the procedure of generating bonding structures capable of being mutually mechanical interlocked comprises:
      forming a first under-bump method (UBM) layer pattern on a substrate:
      forming a second UBM layer pattern on the first UBM layer pattern; and forming a bump on the second UBM layer pattern, so as to form the bonding structures capable of being mutually mechanical interlocked, wherein the bump is bonded with the first UBM layer pattern when the bonding structures capable of being mutually mechanical interlocked are bonded.

2. The method according to claim 1, wherein the bump is bonded with the first UBM layer pattern by applying low pressure and conducting thermal annealing treatment.

3. The method according to claim 1, wherein the first UBM layer pattern is composed of an adhesion layer on the substrate and a seed layer on the adhesion layer.

4. The method according to claim 2, wherein the first UBM layer pattern is composed of an adhesion layer on the substrate and a seed layer on the adhesion layer.

5. The method according to claim 4, wherein the adhesion layer is formed by a metal material that can adhere to the substrate.

6. The method according to claim 5, wherein the adhesion layer is formed by at least one of TiN, TiW, Ti, Cr, Ta, Mo, and Co.

7. The method according to claim 4, wherein the seed layer is formed by a metal material.

8. The method according to claim 7, wherein the seed layer is formed by Cu.

9. The method according to claim 1, wherein the bump is formed by a metal material.

10. The method according to claim 1, wherein the bonding sections of the bonding structures capable of being mutually mechanical interlocked are beveled sections.

11. The method according to claim 1, wherein the bonding sections of the bonding structures capable of being mutually mechanical interlocked are beveled sections.

12. The method according to claim 2, wherein the bonding sections of the bonding structures capable of being mutually mechanical interlocked are beveled sections.

13. The method according to claim 5, wherein the bonding sections of the bonding structures capable of being mutually mechanical interlocked are beveled sections.

14. The method according to claim 6, wherein the bonding sections of the bonding structures capable of being mutually mechanical interlocked are beveled sections.

15. The method according to claim 7, wherein the bonding sections of the bonding structures capable of being mutually mechanical interlocked are beveled sections.

16. The method according to claim 8, wherein the bonding sections of the bonding structures capable of being mutually mechanical interlocked are beveled sections.

17. A bonding structure formed with the method according to claim 1.

18. The bonding structure according to claim 17, wherein the bonding sections of the bonding structures capable of being mutually mechanical interlocked are beveled sections.

* * * * *